US008853936B2

(12) United States Patent
Sugizaki et al.

(10) Patent No.: US 8,853,936 B2
(45) Date of Patent: Oct. 7, 2014

(54) ORGANIC ELECTROLUMINESCENT DEVICE AND LIGHTING APPARATUS

(71) Applicants: Tomoko Sugizaki, Kanagawa-ken (JP); Daimotsu Kato, Tokyo (JP); Keiji Sugi, Kanagawa-ken (JP); Tomio Ono, Kanagawa-ken (JP); Yasushi Shinjo, Kanagawa-ken (JP); Yukitami Mizuno, Tokyo (JP); Akio Amano, Tokyo (JP); Tomoaki Sawabe, Tokyo (JP); Toshiya Yonehara, Kanagawa-ken (JP); Shintaro Enomoto, Kanagawa-ken (JP)

(72) Inventors: Tomoko Sugizaki, Kanagawa-ken (JP); Daimotsu Kato, Tokyo (JP); Keiji Sugi, Kanagawa-ken (JP); Tomio Ono, Kanagawa-ken (JP); Yasushi Shinjo, Kanagawa-ken (JP); Yukitami Mizuno, Tokyo (JP); Akio Amano, Tokyo (JP); Tomoaki Sawabe, Tokyo (JP); Toshiya Yonehara, Kanagawa-ken (JP); Shintaro Enomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 13/719,461

(22) Filed: Dec. 19, 2012

(65) Prior Publication Data
US 2013/0250557 A1    Sep. 26, 2013

(30) Foreign Application Priority Data

Mar. 23, 2012  (JP) .................................. 2012-067199

(51) Int. Cl.
*H01L 51/50*  (2006.01)
*H01L 51/52*  (2006.01)
*H01L 51/54*  (2006.01)
*F21L 4/00*  (2006.01)

(52) U.S. Cl.
CPC ........ *H01L 51/5203* (2013.01); *H01L 51/5225* (2013.01); *F21L 4/00* (2013.01); *H01L 51/5212* (2013.01); *H01L 2251/5361* (2013.01)
USPC ............................ 313/505; 313/503; 313/506

(58) Field of Classification Search
USPC .................................................. 313/498–512
See application file for complete search history.

(56) References Cited

U.S. PATENT DOCUMENTS

| 5,912,652 | A  | * | 6/1999  | Seo ................................. 345/60 |
| 6,603,454 | B1 | * | 8/2003  | Nakamura et al. ............... 345/97 |
| 6,930,448 | B2 | * | 8/2005  | Kim ............................... 313/506 |
| 7,826,026 | B2 | * | 11/2010 | Yoon ............................. 349/155 |

(Continued)

FOREIGN PATENT DOCUMENTS

JP    2011-23336    2/2011

OTHER PUBLICATIONS

U.S. Appl. No. 14/077,644, filed Nov. 12, 2013, Sawabe, et al.

(Continued)

*Primary Examiner* — Nimeshkumar Patel
*Assistant Examiner* — Jose M Diaz
(74) *Attorney, Agent, or Firm* — Oblon, Spivak, McClelland, Maier & Neustadt, L.L.P.

(57) ABSTRACT

According to one embodiment, an organic electroluminescent device includes a first electrode, a plurality of second electrodes and an organic light-emitting layer. The first electrode includes a first major surface and is optical transparency. The second electrodes extend in a first direction parallel to the first major surface and are separated from each other in a second direction parallel to the first major surface and perpendicular to the first direction. An optical transmittance of the second electrodes is lower than an optical transmittance of the first electrode. A distance along the second direction between a line extending in the first direction and a side surface of each of the second electrodes continuously increases and decreases along the first direction. The side surface is unparallel to the first major surface. The organic light-emitting layer is provided between the first electrode and the second electrodes.

20 Claims, 8 Drawing Sheets

(56) References Cited

U.S. PATENT DOCUMENTS

| | | | |
|---|---|---|---|
| 7,906,898 B2* | 3/2011 | Lee | 313/504 |
| 8,648,346 B2* | 2/2014 | Isa et al. | 257/59 |
| 2002/0014837 A1* | 2/2002 | Kim et al. | 313/505 |
| 2002/0051107 A1* | 5/2002 | Nagayama et al. | 349/113 |
| 2005/0029930 A1* | 2/2005 | Yamazaki | 313/503 |
| 2006/0118795 A1* | 6/2006 | Araki | 257/83 |
| 2007/0182885 A1* | 8/2007 | Egi et al. | 349/96 |
| 2008/0116791 A1* | 5/2008 | Kim | 313/504 |
| 2009/0206733 A1* | 8/2009 | Hwang et al. | 313/504 |
| 2009/0305444 A1* | 12/2009 | Yoon | 438/27 |
| 2010/0085508 A1* | 4/2010 | Kang et al. | 349/64 |
| 2010/0308715 A1* | 12/2010 | Chou et al. | 313/504 |
| 2011/0148944 A1* | 6/2011 | Kobayashi | 345/690 |
| 2012/0019752 A1* | 1/2012 | He et al. | 349/117 |
| 2013/0063371 A1* | 3/2013 | Lee et al. | 345/173 |

OTHER PUBLICATIONS

Office Action issued on Feb. 4, 2014 in the counterpart Korean patent Application No. 10-2013-0012483 (with English Translation).
Office Action issued Apr. 15, 2014 in Japanese Patent Application No. 2012-067199 with English language translation.

\* cited by examiner

SP31
SP34

SP32
SP35

SP33

ORGANIC ELECTROLUMINESCENT DEVICE AND LIGHTING APPARATUS

CROSS-REFERENCE TO RELATED APPLICATIONS

This application is based upon and claims the benefit of priority from the prior Japanese Patent Application No. 2012-067199, filed on Mar. 23, 2012; the entire contents of which are incorporated herein by reference.

FIELD

Embodiments described herein relate generally to an organic electroluminescent device and a lighting apparatus.

BACKGROUND

Recently, an organic electroluminescent device has attracted a great deal of attention due to its use in a surface light source or the like. In the organic electroluminescent device, an organic thin film is provided between two electrodes. When a current is applied to the organic film, electrons and holes are injected into and recombine in the organic thin film, thereby generating excitons. The electroluminescence occurring when the excitons experience radiative deactivation is used.

In connection with the organic electroluminescent device, applications that could not have been achieved so far by current lighting apparatuses and/or light sources are expected due to its features such as thinness, light weight, and surface emission.

DETAILED DESCRIPTION

According to one embodiment, an organic electroluminescent device includes a first electrode, a plurality of second electrodes and an organic light-emitting layer. The first electrode includes a first major surface and is optical transparency. The second electrodes extend in a first direction parallel to the first major surface and are separated from each other in a second direction parallel to the first major surface and perpendicular to the first direction. An optical transmittance of the second electrodes is lower than an optical transmittance of the first electrode. A distance along the second direction between a line extending in the first direction and a side surface of each of the second electrodes continuously increases and decreases along the first direction. The side surface is unparallel to the first major surface. The organic light-emitting layer is provided between the first electrode and the second electrodes.

According to another embodiment, a lighting apparatus includes an organic electroluminescent device and a power supply unit. The organic electroluminescent device includes a first electrode, a plurality of second electrodes and an organic light-emitting layer. The first electrode includes a first major surface and is optical transparency. The second electrodes extend in a first direction parallel to the first major surface and are separated from each other in a second direction parallel to the first major surface and perpendicular to the first direction. An optical transmittance of the second electrodes is lower than an optical transmittance of the first electrode. A distance along the second direction between a line extending in the first direction and a side surface of each of the second electrodes continuously increases and decreases along the first direction. The side surface is unparallel to the first major surface. The organic light-emitting layer is provided between the first electrode and the second electrodes. The power supply unit is electrically connected between the first electrode and the second electrodes and supplies a current to the organic light-emitting layer through the first electrode and the second electrodes.

Various embodiments will be described hereinafter referring to the accompanying drawings.

The drawings are schematic and conceptual ones, and a relation between thickness and width of each component, and a ratio of scales of components may not be necessarily identical to real ones. Moreover, even when the same or similar components are shown in plural drawings, they may be illustrated in different sizes or scales from drawing to drawing. Moreover, through the specification of the application and the drawings, when substantially the same components as those shown in previously described drawings are denoted by same reference signs in the following drawings and the detailed description thereof will not be repeated.

First Embodiment

Figure 1:
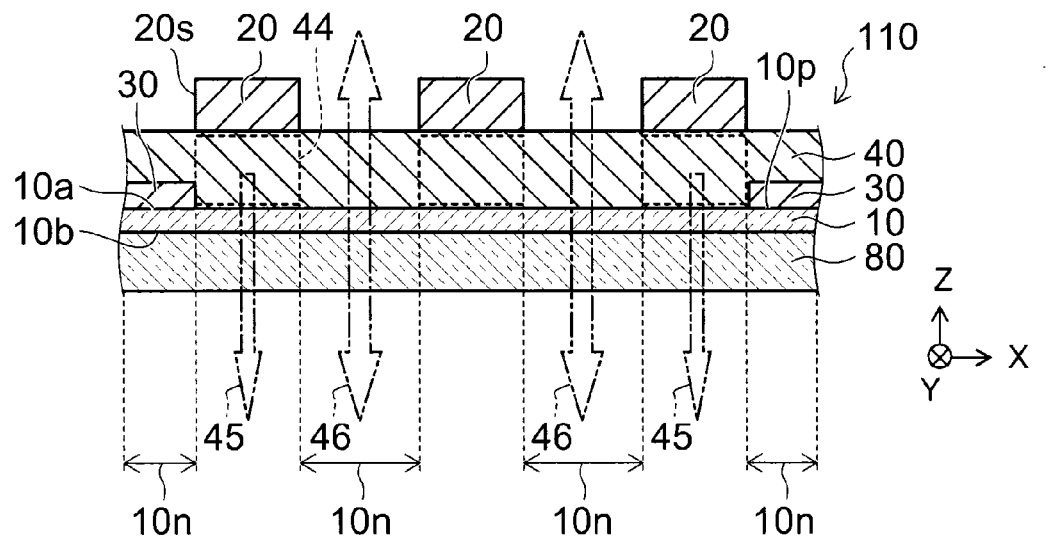
FIG. 1 is a schematic cross-sectional view illustrating the configuration of an organic electroluminescent device according to a first embodiment.

FIG. 1 is a schematic cross-sectional view illustrating the configuration of an organic electroluminescent device according to a first embodiment.

Figure 2:
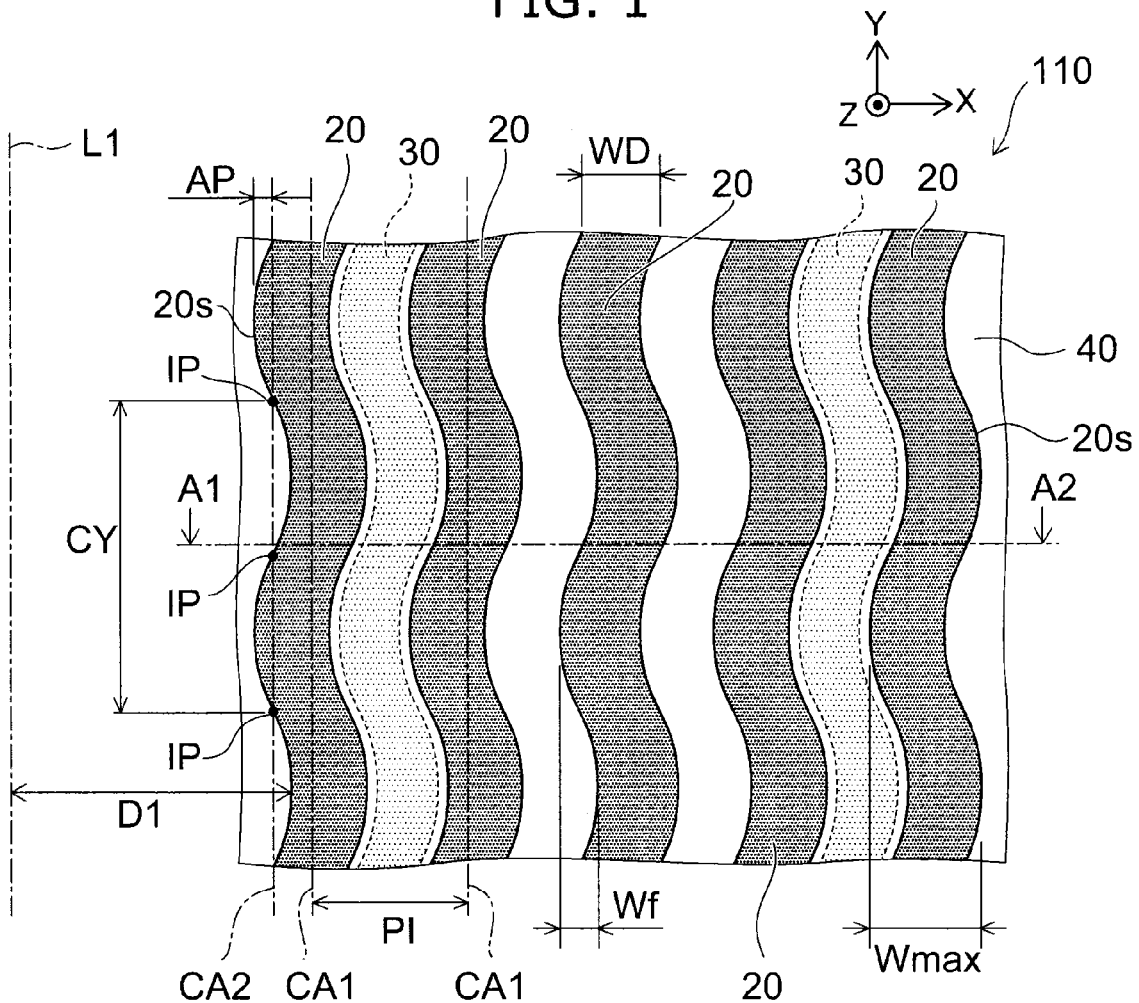
FIG. 2 is a schematic plan view illustrating the configuration of a portion of the organic electroluminescent device according to the first embodiment.

FIG. 2 is a schematic plan view illustrating the configuration of a portion of the organic electroluminescent device according to the first embodiment. FIG. 1 is a cross-sectional view taken along A1-A2 line of FIG. 2.

As shown in FIG. 1 and FIG. 2, an organic electroluminescent device 110 includes a first electrode 10, a plurality of second electrodes 20, and an organic light-emitting layer 40.

The first electrode 10 has a first major surface 10a and a second major surface 10b. The second major surface 10b is an opposite face of the first major surface 10a. The first electrode 10 is optical transparency. The first electrode 10 is, for example, a transparent electrode. The first major surface 10a is substantially parallel to the second major surface 10b.

Here, a direction which is perpendicular to the first major surface 10a is defined as Z-axis direction. One of directions which are parallel to the first major surface 10a is defined as X-axis direction (second direction). A direction which is parallel to the first major surface 10a and perpendicular to the X-axis direction is defined as Y-axis direction (first direction). The X-axis direction and the Y-axis direction are perpendicular to the Z-axis direction. The Z-axis direction corresponds to a direction of thickness of the first electrode 10.

The plurality of second electrodes 20 faces a portion of the first major surface 10a of the first electrode 10. An optical transmittance of the plurality of second electrodes 20 is lower than an optical transmittance of the first electrode 10. The second electrode 20 is, for example, light reflective. An optical reflectivity of the second electrode 20 is higher than an optical reflectivity of the first electrode 10. The plurality of second electrodes 20 is, for example, metal electrodes. In the specification of the application, the state "face" refers to a state in which elements on opposite sides indirectly face each other with another element interposed therebetween as well as a state in which elements on opposite sides directly face each other without nothing therebetween. In the specification of the application, the state "provided on" refers to a state in which one element is in direct contact with another element as well as a state in which a certain element is inserted between two elements. The state "stacked" refers to a state in which elements are overlap so as to be in direct contact with each other as well as a state in which elements overlap each other with a certain element inserted between them.

As shown in FIG. 2, the plurality of second electrodes 20, each extending along the first direction which is parallel to the first major surface 10a, is separated from each other in the second direction which is parallel to the first major surface 10a and perpendicular to the first direction. With this arrangement, the plurality of second electrodes 20 is formed to a band-like pattern shape. The plurality of second electrodes 20 is all at an equal interval, for example. In this example, the first direction is the Y-axis direction. The second direction is the X-axis direction. The first direction and the second direction may be arbitrary directions extending along an X-Y plane.

A distance D1 along the X-axis direction, between a side surface 20s of the second electrode 20 in the X-axis direction, and a line L1 extending along the Y-axis direction, continuously increases and decreases along the Y-axis direction. Each of the side surfaces 20s of the plurality of second electrodes 20 changes along the Y-axis direction in a wave form. The side surfaces 20s are two side surfaces of the second electrode 20 in the X-axis direction. The position of the side edge in the X-axis direction of each of the plurality of second electrodes 20 varies in a wave form along the Y-axis direction. The increase and decrease of a distance D1 are periodic. In this example, the positions of the side surface 20s periodically vary, for example, in a sinusoidal waveform. For example, the distance D1 increases and decreases in a wave shape. The position of the line L1 in the X-axis direction may be arbitrary.

In this example, the side surface 20s of the second electrode 20 is a face, for example, parallel to the Z-axis direction. That is, in this example, the side surface 20s is a face, for example, perpendicular to the X-Y plane. The side surface 20s may be a face, for example, unparallel to the Z-axis direction. The side surface 20 may be, for example, a curved face. The side surface 20s is a face, for example, having a component varying at least in the Z-axis direction, at a position of the edge of the second electrode 20 in the X-axis direction. The side surface 20s is a face unparallel to the first major surface 10a.

The variation of one side surface of the second electrode 20 is substantially the same as the variation of the other side surface of the second electrode 20. A length (width) WD along the X-axis direction of each of the plurality of second electrodes 20 is substantially the same over a way in the Y-axis direction. That is, each of the plurality of second electrodes 20 has a belt shape periodically meandering in a waveform. A variation ratio in the Y-axis direction of the length WD of each of the plurality of second electrodes 20 is, for example, not more than 10%.

The length WD is, for example, not less than 1 μm and not more than 2000 μm. A pitch in the X-axis direction between two second electrodes 20 which are closest to each other (i.e., a distance between first medial axes CA1 in the X-axis direction of the second electrodes 20) is represented by PI. The pitch PI is, for example, not less than 0.35 mm and not more than to 3.5 mm. A length (width) along the X-axis direction of each of the plurality of second electrodes 20 is represented by WD, amplitude of the variation of the side surface 20s is represented by AP, and a distance of one period of the variation of the side surface 20s is represented by CY. For this case, a ratio CY/PI between the distance CY and the pitch PI is, for example, not less than 2 and not more than 7. A ratio AP/PI between the amplitude AP and the pitch PI is, for example, not less than 0.2 and not more than 0.75.

A line segment that passes the center of the width Wmax along the X-axis direction between vertexes in the X-axis direction of the second electrode 20 is referred to as a first medial axis CA1. The pitch PI is, for example, a distance along the X-axis direction between the first medial axes CA1 of two second electrodes 20 which are closest to each other. The width of the variation of the side surface 20s of the second electrode 20 is referred to as a variation band Wf. A line segment that passes the center of the variation band Wf is referred to as a second medial axis CA2. The amplitude AP is, for example, a distance along the X-axis direction between the second medial axis A2 and a position of the side surface 20s which is farthest from the second medial axis CA2 in the X-axis direction. The amplitude AP is, for example, ½ times the variation band Wf. The distance CY is, for example, when each intersection of the second medial axis CA2 and the side surface 20s is represented by IP, two times a distance between the intersections IP that are closest each other.

The organic light-emitting layer 40 is provided between the first major surface 10a of the first electrode 10 and the second electrodes 20. In the organic light-emitting layer 40, for example, when an electrical current is applied through the first electrode 10 and the second electrodes 20, electrons and holes recombine and thus excitons are generated. The organic light-emitting layer 40 emits light by using the emission of light when the excitons experience radiative deactivation for example. The organic light-emitting layer 40 is optical transparency, for example, in a state in which it does not emit light.

The organic light-emitting layer 40 is transparent, for example, in a state in which it does not emit light.

The organic electroluminescent device 110 further includes a plurality of interconnections 30 and a substrate 80. For example, the plurality of interconnections 30 is provided between the first electrode 10 and the organic light-emitting layer 40. In this example, for example, the first electrode 10 is provided between the plurality of interconnections 30 and the substrate 80. The substrate 80 is optical transparency. The substrate 80 is, for example, a transparent substrate. The plurality of interconnections 30 and the substrate 80 may be suitably provided for the organic electroluminescent device 110, or may not be provided.

Each of the plurality of interconnections 30 extends along a planar face parallel to the first major surface 10a. That is, the plurality of interconnections 30 extends within the X-Y plane. In this example, each of the plurality of interconnections 30 is provided on the first major surface 10a of the first electrode 10. Each of the plurality of interconnections 30 is provided in a region 10p within a portion 10n of the first major surface 10a, the portion not overlapping any one of the plurality of second electrodes 20 when it is projected on a planar face (X-Y plane) parallel to the first major surface 10a (that is, when it is viewed in the Z-axis direction). The portion not overlapping any one of the plurality of the second electrodes 20 is a portion existing between two second electrodes 20 which are closest to each other when it is projected on the X-Y plane. The plurality of interconnections 30 may be provided on the second major surface 10b of the first electrode 10. In this case, the plurality of interconnections 30 is provided in a region within a portion of the second major surface 10b, the portion not overlapping any one of the plurality of second electrodes 20 when it is projected on the X-Y plane.

As shown in FIG. 2, each of the plurality of interconnections 30 extends, for example, along the Y-axis direction, and is separated from each other in the X-axis direction. That is, the plurality of interconnections 30 has a pattern shape of a band shape. A gap between each of the plurality of interconnections 30 is constant for example. Each of the plurality of interconnections 30 has the substantially same shape as the second electrodes 20. In this example, each of the plurality of interconnections 30 has a belt shape which periodically meanders in a waveform. Moreover, the gap between each of the plurality of interconnections 30 is, for example, wider than a gap between each of the plurality of second electrodes 20. In this example, for example, one interconnection 30 is provided for every three second electrodes 20. The pattern shape of the interconnection 30 is arbitrary. For example, the interconnections 30 may be formed in a lattice configuration.

An electrical conductance of the plurality of interconnections 30 is higher than an electrical conductance of the first electrode 10. The plurality of interconnections 30 is light reflective. The plurality of interconnections 30 are, for example, metallic interconnections. The plurality of interconnections 30 functions, for example, as auxiliary electrodes that transmit an electric current that flows across the first electrode 10. The first electrode 10 is at least partially exposed from the plurality of interconnections 30.

The plurality of interconnections 30 has a higher optical reflectivity than the first electrode 10. In the specification of the application, a state of having an optical reflectivity higher that of the first electrode 10 is referred to as a state of being light reflecting reflective. An insulating layer (not shown) may be provided on the upper face and the side surfaces of each of the plurality of interconnections 30.

The first electrode 10 has a higher optical transmittance than the interconnection 30 and the second electrode 20. In the specification of the application, a state of having an optical transmittance higher than that of the interconnection 30 and that of the second electrode 20 is referred to as a state of being optical transparency. For example, the optical transmittance of the substrate 80 is higher than that of the second electrode 20 and that of interconnection 30.

In the organic electroluminescent device 110, the organic light-emitting layer 40, at a position where the first electrode 10 and the second electrode 20 face each other, serves as a light-emitting region 44. Emitted light 45 emitted from the light-emitting region 44 irradiates outside the organic electroluminescent device 110 through the first electrode 10 and the substrate 80. A portion of the emitted light 45 reflects from the second electrode 20, and irradiates outside through the first electrode 10 and the substrate 80.

In the organic electroluminescent device 110, external light 46 being incident from outside passes through the organic light-emitting layer 40, the first electrode 10, and the substrate 80. In this way, the organic electroluminescent device 110 transmits the external light 46, which is incident on the organic electroluminescent device 110 from the outside, while irradiating the emitted light 45. That is, the organic electroluminescent device 110 is optical transparency. For example, the organic electroluminescent device 110 is transparent. In the organic electroluminescent device 110, a background image may be visible through the organic electroluminescent device 110. That is, the organic electroluminescent device 110 is a film-shaped or plate-shaped light source of a see-through type.

An optical transparency organic electroluminescent device can be provided by using the organic electroluminescent device 110 of the embodiment. When this organic electroluminescent device 110 is applied to a lighting apparatus, various kinds of new applications can be achieved in addition to the lighting function due to its function of transmitting the background image.

Moreover, when it is assumed that the second electrode 20 having a wave shape and the second electrode 20 having a linear shape are the same as each other in the length WD and the pitch PI, a contact area of the second electrode 20 having a wave shape and the organic light-emitting layer 40 may be larger than that of the second electrode 20 having a linear shape. That is, in the case of the second electrode 20 having a wave shape, an area of the light-emitting region 44 may be increased compared to the case of using the second electrode 20 having a linear shape. As a result, in the case of using the second electrode 20 having a wave shape, the brightness of the organic light-emitting layer 40 may be improved compared to the case of using the second straight electrode 20 having a linear shape. In addition, the second electrodes 20 having a wave shape may be more uniformly distributed over the first major surface 10a compared to the second electrodes 20 having a linear shape. Therefore, the more uniform luminescence can be obtained by using the second electrode 20 having a wave shape than by using the second electrode 20 having a linear shape.

In the organic electroluminescent device, it is considered that the second electrodes 20 are preferably miniaturized to an extent that the second electrodes 20 being not transparent are not visible to secure the transparency. However, when the second electrodes 20 are formed by using a usual metal mask, the miniaturization limit is about 100 μm. If a highly fine metal mask is used, the second electrodes 20 can be miniaturized to an extent of several μm, but, this causes another problem, for example, the manufacturing process becomes complicated. For example, the cost increases.

In connection with man's perception of shape, the variation of the brightness perceivable with the spatial frequency is different. There is contrast sensitivity as a scale that shows the man's perception of shape. In general, the contrast sensitivity is the highest in the vicinity of 2 to 10 cycles per degree, and the contrast sensitivity decreases at both lower frequencies and higher frequencies. In particular, when the frequency is increased, the decrease in the sensitivity is remarkable. And, when it reaches the limit, the perception is not possible even though the contrast is increased. The spatial frequency at this time is considered to be 50 to 60 cycles per degree. Therefore, the visibility greatly depends on the distance to an object, and a gap between lines (pitch PI).

In the organic electroluminescent device 110, for example, a ratio CY/PI between the distance CY and the pitch PI is set to be, for example, not less than 2 and not more than 7. A ratio AP/PI between the amplitude AP and the pitch PI is set to be, for example, not less than 0.2 and not more than 0.75. These conditions were derived through evaluation tests, to be described later, conducted by the inventor(s) of the application. With this setting of the conditions, the second electrodes 20 may become hard to be visible while the transparency can be secured. That is, in the organic electroluminescent device 110, even when the thickness of the second electrode 20 is comparatively large for example, the second electrode 20 is hard to be visible. Accordingly, it becomes possible to avoid using a highly fine metal mask for formation of the second electrode 20, and, for example, complication of the manufacturing process may be suppressed.

Figure 3:
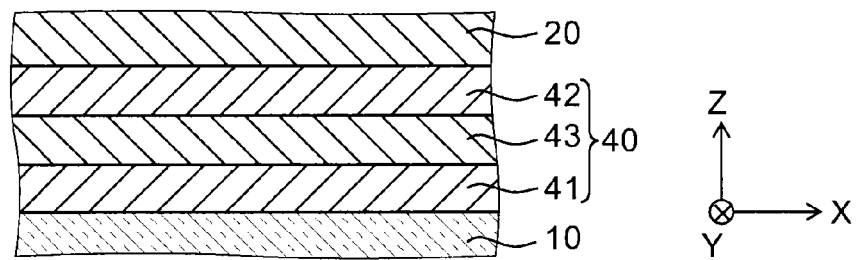
FIG. 3 is a schematic cross-sectional view illustrating the configuration of a portion of the organic electroluminescent device according to the first embodiment.

FIG. 3 is a schematic cross-sectional view illustrating the configuration of a portion of the organic electroluminescent device according to the first embodiment.

As shown in FIG. 3, the organic light-emitting layer 40 includes a light-emitting portion 43. The organic light-emitting layer 40 may further include at least one of a first layer 41 and a second layer 42 as necessary. The light-emitting portion 43 emits light including the wavelength of the visible light. The first layer 41 is provided between the light-emitting portion 43 and the first electrode 10. The second layer 42 is provided between the light-emitting portion 43 and the second electrode 20.

The light-emitting portion 43 may be made of, for example, material of $Alq_3$ (tris(8-hydroxy-quinolinolato)aluminum), F8BT (poly(9,9-dioctyl-fluorene-co-benzothiadiazole)), PPV (polyparaphenylene vinylene), or the like. The light light-emitting portion 43 may be made of a mixture material of a host material and a dopant added to the host material. Examples of the host material include CBP (4,4'-N,N'-bisdicarbazolyl-biphenyl), BCP (2,9-dimethyl-4,7-diphenyl-1,10-phenanthroline), TPD (2,9-dimethyl-4,7diphenyl-1,10-phenanthroline), PVK (polyvinylcarbazole), and PPT (poly(3-phenylthiophene)). Examples of the dopant material include Flrpic (iridium(III)bis(4,6-di-fluorophehyl)-pyridinato-N,C2'-picolinate), Ir(ppy)$_3$(tris(2-phenyl pyridine) iridium), and Flr6 (bis(2,4-difluorophenyl pyridinato)-tetrakis(1-pyrazolyl)bolart iridium(III)).

The first layer 41 functions, for example, as a hole injection layer. The first layer 41 functions, for example, as a hole transporting layer. The first layer 41 may have a multilayer structure including, for example, a layer that functions as a hole injection layer and a layer that functions as a hole transporting layer. The first layer 41 may further include an additional layer other than the layer that functions as a hole injection layer and other than the layer that functions as a hole transporting layer.

The second layer 42 can include, for example, a layer that functions as an electronic injection layer. The second layer 42 can include, for example, a layer that functions as an electron transporting layer. The second layer 42 may have a multilayer structure including, for example, a layer that functions as an electron injection layer and a layer that functions as an electron transporting layer. The second layer 42 may further include an additional layer other than the layer that functions as an electron injection layer and other than the layer that functions as an electron transporting layer.

For example, the organic light-emitting layer 40 emits light including a component of the wavelength of the visible light. For example, the light emitted from the organic light-emitting layer 40 is substantially white light. That is, the light emitted from the organic electroluminescent device 110 is the white light. Here, the "white light" is substantially white and includes, for example, red-based, yellow-based, green-based, blue-based, and purple-based white light.

For example, the first electrode 10 includes an oxide material including at least one element selected from the group consisting of In, Sn, Zn, and Ti. The first electrode 10 may use a film (for example, NESA or the like) prepared by using a conductive glass including indium oxides, zinc oxides, tin oxides, Indium Tin Oxide (ITO) films, tin oxides doped with fluorine (FTO), and indium zinc oxides. The first electrode 10 functions, for example, as an anode.

The second electrode 20 includes at least one of aluminum and silver for example. For example, an aluminum film is used for the second electrode 20. In addition, an alloy of silver and magnesium may be used as the second electrode 20. Calcium may be added to the alloy. The second electrode 20 functions, for example, as a cathode.

The interconnection 30 includes at least one element selected from the group consisting of Mo, Ta, Nb, Al, Ni, and Ti, for example. For example, the interconnection 30 may be made of a mixed film including an element selected from the group. The interconnection 30 may be formed of a multilayer film including those elements. For example, the interconnection 30 may be formed of a multilayer film of Nb/Mo/Al/Mo/Nb. For example, the interconnection 30 functions as an auxiliary electrode that suppresses a potential drop of the first electrode 10. The interconnection 30 can function as a lead electrode for supplying an electrical current.

A transparent glass, such as, quartz glass, alkali glass, and non-alkali glass is used as the substrate 80. The substrate may be a transparent resin, such as, polyethylene terephthalate, polycarbonate, polymethyl methacrylate, polypropylene, polyethylene, amorphous polyolefine, and fluoro-based resin.

Figure 4:
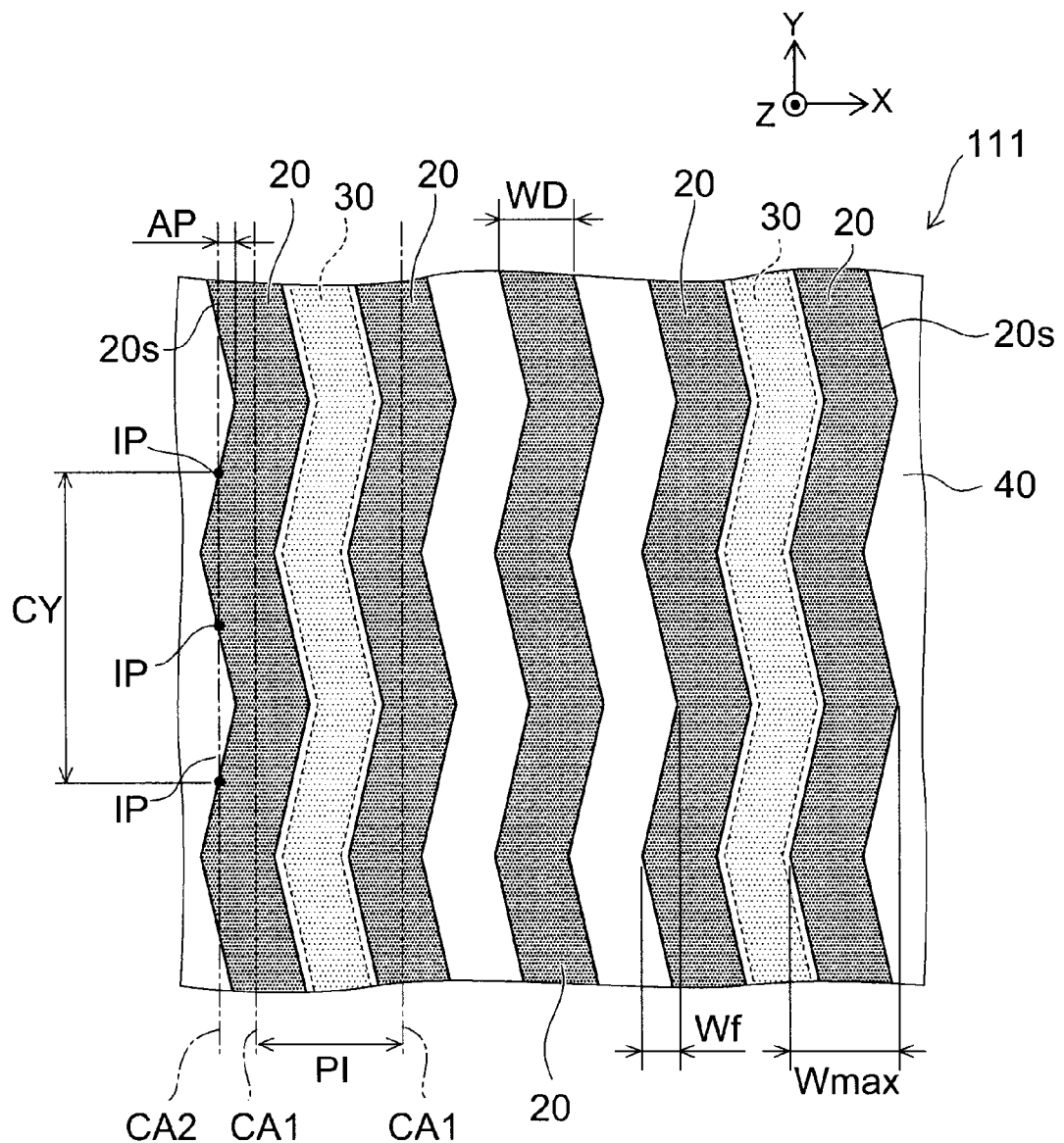
FIG. 4 is a schematic plan view illustrating the configuration of a portion of another organic electroluminescent device according to the first embodiment.

FIG. 4 is a schematic plan view illustrating the configuration of a portion of another organic electroluminescent device according to the first embodiment.

As shown in FIG. 4, in another electroluminescent device 111 according to the embodiment, a side surface 20s may periodically vary, for example, in a triangular waveform. In the organic electroluminescent device 111, each of a plurality of second electrodes 20 has a belt shape that periodically meanders in a zigzag shape. For example, the distance D1 increases and decreases in a zigzag shape. In this example, a first direction is Y-axis direction. A second direction is X-axis direction. In the plurality of second electrodes 20 each having a zigzag shape, a variation ratio in the Y-axis direction of a length WD is not more than 10%.

In the organic electroluminescent device 111, a ratio CY/PI between a pitch PI and a distance CY is, for example, not less than 2 and not more than 7. A ratio AP/PI between the pitch PI and an amplitude AP is, for example, not less than 0.2 and not more than 0.75.

Even with the organic electroluminescent device 111 in which the second electrode 20 has a zigzag shape, an organic electroluminescent device being optical transparency can be provided. When it is assumed that second electrodes having a zigzag shape and second electrodes having a linear shape are the same in length WD and pitch PI, the organic electroluminescent device 111 exhibits increased luminous efficiency compared to the case of using the second electrode 20 having a linear shape. In the organic electroluminescent device 111, more uniform luminescence can be obtained compared with the case of using the second electrodes 20 having a linear shape. Moreover, in the organic electroluminescent device 111, the second electrodes 20 may become hard to be visible while the transparency is secured. In the organic electroluminescent device 111, for example, the complication of the manufacturing process is suppressed.

In the embodiment, when the second electrodes 20 are conspicuous, it is difficult to see a background image. Therefore, the inventor(s) of the application has examined the conditions under which the second electrodes 20 become hard to be conspicuous. For this examination, three kinds of tests were conducted. In a first test, the difference in the pattern shape of the second electrode 20 was evaluated. In a second test, the difference in the distance CY of one period of the second electrode 20 was evaluated. In a third test, the difference in the amplitude AP of the second electrode 20 was evaluated. In each test, samples, in which a pattern of the second electrode 20 was formed with a black pigment on a transparent film, were used. For each test, a plurality of samples with different patterns was prepared. A plurality of subjects was made to observe each of the plurality of samples. In the examination, each of the plurality of subjects evaluated the plurality of samples on whether the subject could recognize the pattern, on brightness of the sample (degree of color brightness), and on easiness in seeing the background.

The first to third tests were conducted under the condition of constant luminous intensity, in the room under fluorescent lamp. Five subjects, from a first subject TS1 to a fifth subject TS5, attended the tests. The average of the eyesight of the first subject TS1 to the fifth subject TS5 was 1.0. In the first to third examinations, the samples had a square shape of about 10 cm in length at each side. The distance between the sample and the subject was set to 5 m. In each evaluation item, an allowable range was set to be not less than 2.

In the evaluation on whether the pattern can be recognized, the following four examination criteria were used:
Evaluation value 1: it is clearly visible;
Evaluation value 2: it is fuzzily visible;
Evaluation value 3: it is nearly invisible; and
Evaluation value 4: it is invisible.

In the evaluation of the brightness of the sample, the following four evaluation criteria were used:
Evaluation value 1: it is dark (it is nearly black);
Evaluation value 2: it is a little dark (dark gray color);
Evaluation value 3: it is a little bright (light gray); and
Evaluation value 4: it is bright (it is nearly transparent).

In the evaluation on the easiness in seeing the background, the following four evaluation criteria were used:
Evaluation value 1: it is invisible;
Evaluation value 2: it is nearly invisible;
Evaluation value 3: it is visible; and
Evaluation value 4: it is clearly visible.

Figure 5A:
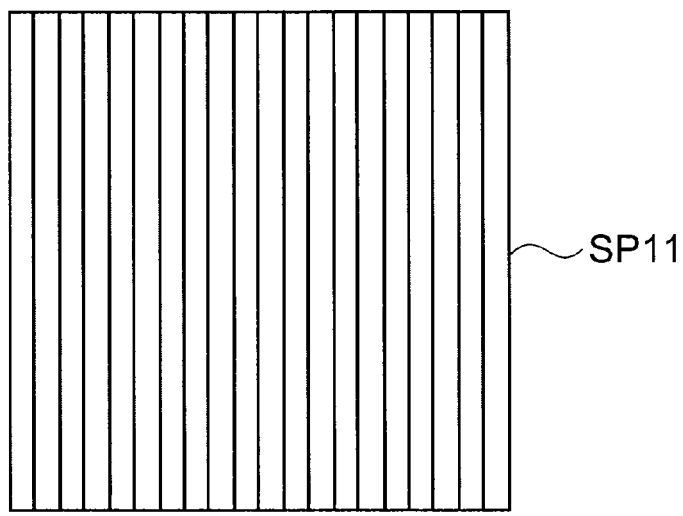
FIGS. 5A to 5C are schematic plan views illustrating the samples used in the first test of the organic electroluminescent device according to the first embodiment.
Figure 5B:
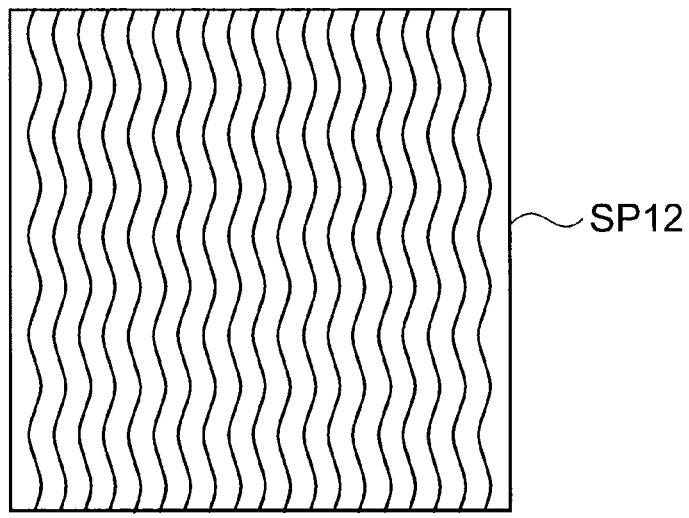
Figure 5C:
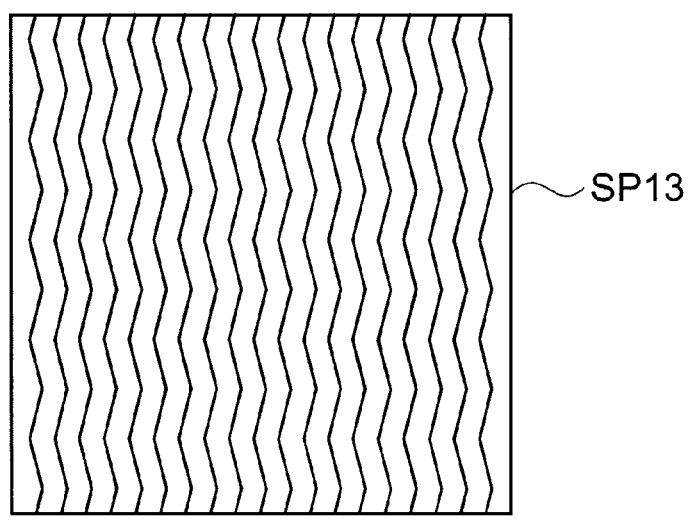

FIG. 5A to FIG. 5C are schematic plan views illustrating the samples used in the first test of the organic electroluminescent device according to the first embodiment.

As shown in FIG. 5A to FIG. 5C, in the first test, three samples, from a first sample for shape evaluation SP11 to a third sample for shape evaluation SP13, were used. A striped pattern was formed in the first sample for shape evaluation SP11 as shown in FIG. 5A. A wavy pattern was formed in the second sample for shape evaluation SP12 as shown in FIG. 5B. A zigzag pattern was formed in the third sample for shape evaluation SP13 as shown in FIG. 5C. One linear line in the first sample for shape evaluation SP11, one wavy line in the second sample for shape evaluation SP12, and one zigzag line in the third sample for shape evaluation SP13 each correspond to one second electrode 20. In this way, the difference of the pattern shape among the stripe shape, the wave shape, and the zigzag shape was evaluated in the first test.

As for the first to third samples for shape evaluation SP11 to SP 13, the width (length WD) of one line in the X-axis direction was 0.26 mm. As for the first to third samples for shape evaluation SP11 to SP 13, a gap (pitch PI) between two lines which were closest to each other in the X-axis direction was 5 mm. As for the second and third samples for shape evaluation SP12 and SP13, the amplitude AP was 1.25 mm. As for the second and third samples for shape evaluation SP12 and SP13, the distance CY of one period was 20 mm.

Table 1 shows the result of the evaluation on whether the pattern can be recognized in the first test. Table 2 shows the result of the evaluation on the brightness of the sample. Table 3 shows the result of the evaluation on the easiness in seeing the background.

Table 1 to Table 3 show evaluation values given by the first to fifth subjects TS1 to TS5 for each of the first to third samples for shape evaluation SP11 to SP13, and an average value Ave for each of the first to third samples for shape evaluation SP11 to SP 13.

TABLE 1

|      | TS1 | TS2 | TS3 | TS4 | TS5 | Ave |
|------|-----|-----|-----|-----|-----|-----|
| SP11 | 1   | 1   | 1   | 1   | 1   | 1   |
| SP12 | 2   | 4   | 3   | 3   | 4   | 3.2 |
| SP13 | 1   | 3   | 3   | 3   | 3   | 2.6 |

TABLE 2

|      | TS1 | TS2 | TS3 | TS4 | TS5 | Ave |
|------|-----|-----|-----|-----|-----|-----|
| SP11 | 3   | 3   | 3   | 4   | 1   | 2.8 |
| SP12 | 2   | 1   | 2   | 2   | 3   | 2   |
| SP13 | 2   | 2   | 2   | 2   | 3   | 2.2 |

TABLE 3

|      | TS1 | TS2 | TS3 | TS4 | TS5 | Ave |
|------|-----|-----|-----|-----|-----|-----|
| SP11 | 2   | 1   | 2   | 2   | 1   | 1.6 |
| SP12 | 4   | 3   | 3   | 3   | 3   | 3.2 |
| SP13 | 2   | 3   | 3   | 4   | 4   | 3.2 |

As shown in Table 1, the wavy pattern and the zigzag pattern are hard to be recognized compared to the striped pattern. As shown in Table 2, the brightness of the striped pattern is slightly higher than the brightness of the wavy pattern and the brightness of the zigzag pattern. The difference between the brightness of the striped pattern and the brightness of the wavy pattern, and the difference between the brightness of the striped pattern and the brightness of the zigzag pattern are not the levels that are considered problems in practical use. As shown in Table 3, the wavy pattern and the zigzag pattern allow the background to be easily seen compared to the striped pattern. In each evaluation item, a remarkable difference was not seen between the wavy pattern and the zigzag pattern. However, in this way, when the wavy pattern or the zigzag pattern is used as the pattern shape of the second electrode 20, the background image can be easily seen.

FIG. 6A to FIG. 6E are schematic plan views that illustrate samples used in the second test of the organic electroluminescent device according to the first embodiment.

Figure 6A:
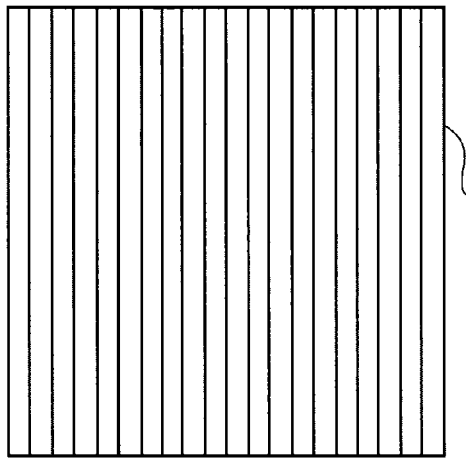
FIGS. 6A to 6E are schematic plan views illustrating samples used in the second test of the organic electroluminescent device according to the first embodiment.
Figure 6D:
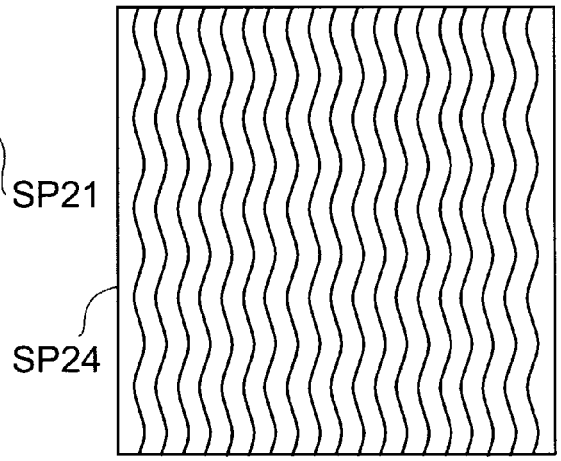
Figure 6B:
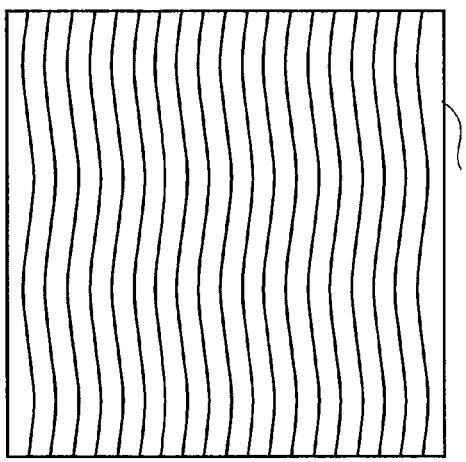
Figure 6E:
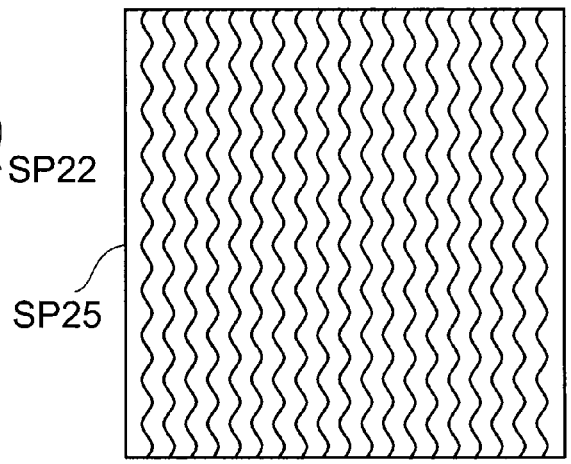
Figure 6C:
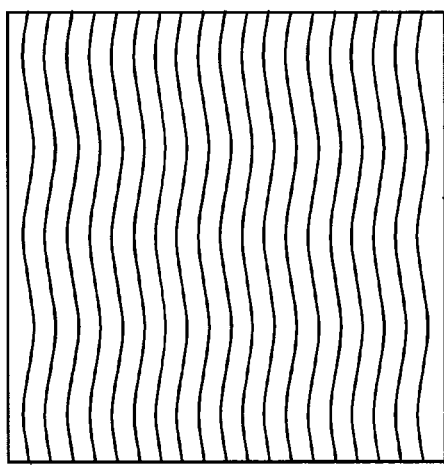

As shown in FIG. 6A to FIG. 6E, five samples, first to fifth samples for period evaluation SP21 to SP25, were used in the second test. As shown in FIG. 6A, a striped pattern was formed in the first sample for period evaluation SP21. As shown in FIG. 6B to FIG. 6E, a wavy pattern was formed in each of the second to fifth samples for period evaluation SP22 to SP25.

In the first to fifth samples for period evaluation SP21 to SP25, a width (length WD) of a line in the X-axis direction was 0.26 mm. In the first to fifth samples for period evaluation SP21 to SP25, a gap (Pitch PI) between two lines which were closest to each other in the X-axis direction was 5 mm. In the second to fifth samples for period evaluation SP22 to SP25, the amplitude AP was 1.25 mm. In the second sample for period evaluation SP22, the distance CY of one period was 50 mm. In the third sample SP23 for the period evaluation, the distance CY of one period was 40 mm. In the fourth sample for period evaluation SP24, the distance CY of one period was 20 mm. In the fifth sample for period evaluation SP25, the distance CY of one period was 10 mm. The pattern of the first sample for period evaluation SP21 was a pattern where the distance CY was infinite. As a result, the difference in the distance CY of one period of each second electrode 20 was evaluated through the second test.

Figure 7:
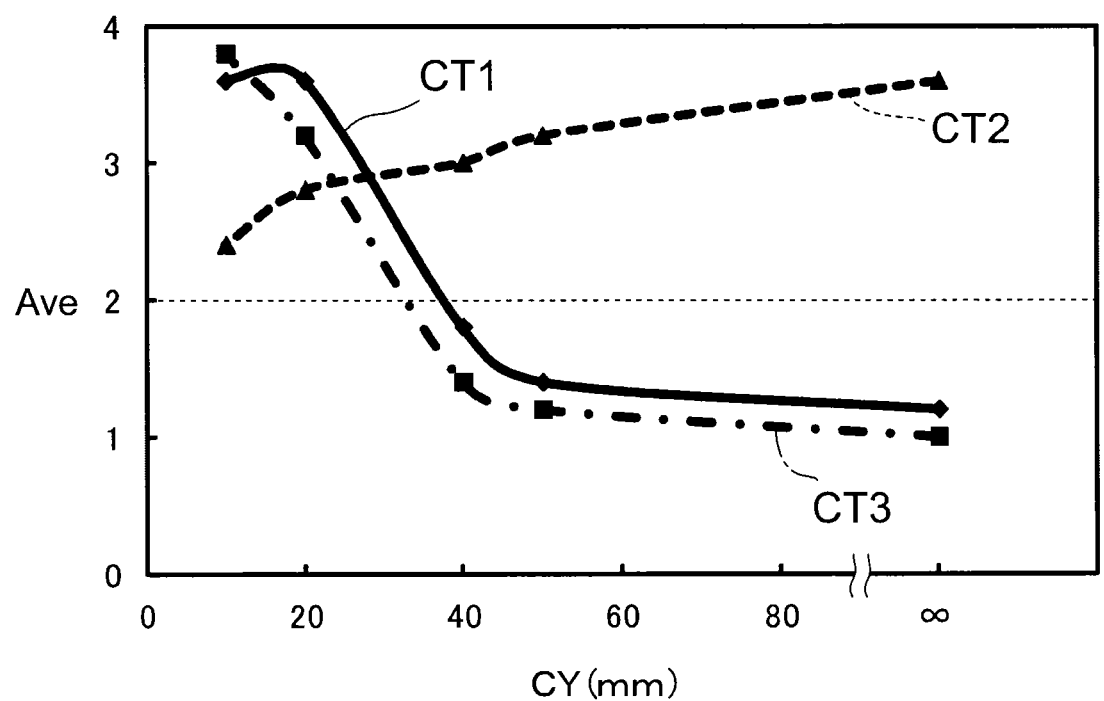
FIG. 7 is a graph that shows the result of the second test of the organic electroluminescent device according to the first embodiment.

FIG. 7 is a graph that shows the result of the second test of the organic electroluminescent device according to the first embodiment.

The vertical axis of FIG. 7 indicates average values Ave of evaluation values. The horizontal axis indicates distances CY (mm). In FIG. 7, characteristic CT1 is the result of the evaluation on whether the pattern can be recognized. Characteristic CT2 is the result of the examination on the brightness of the sample. Characteristic CT3 is the result of the evaluation on the easiness in seeing the background. Moreover, the result of the evaluation on whether the pattern can be recognized in the second test is shown in Table 4. Table 5 shows the result of the evaluation on the brightness of the sample. Table 6 shows the result of the evaluation on the easiness in seeing the background.

TABLE 4

|      | TS1 | TS2 | TS3 | TS4 | TS5 | Ave |
|------|-----|-----|-----|-----|-----|-----|
| SP21 | 1   | 1   | 2   | 1   | 1   | 1.2 |
| SP22 | 1   | 1   | 2   | 2   | 1   | 1.4 |
| SP23 | 2   | 1   | 2   | 2   | 2   | 1.8 |
| SP24 | 4   | 4   | 4   | 3   | 3   | 3.6 |
| SP25 | 3   | 4   | 4   | 3   | 4   | 3.6 |

TABLE 5

|      | TS1 | TS2 | TS3 | TS4 | TS5 | Ave |
|------|-----|-----|-----|-----|-----|-----|
| SP21 | 4   | 3   | 4   | 4   | 3   | 3.6 |
| SP22 | 3   | 3   | 4   | 3   | 3   | 3.2 |
| SP23 | 3   | 3   | 3   | 3   | 3   | 3   |
| SP24 | 2   | 4   | 2   | 3   | 3   | 2.8 |
| SP25 | 1   | 2   | 3   | 2   | 4   | 2.4 |

TABLE 6

|      | TS1 | TS2 | TS3 | TS4 | TS5 | Ave |
|------|-----|-----|-----|-----|-----|-----|
| SP21 | 1   | 1   | 1   | 1   | 1   | 1   |
| SP22 | 1   | 2   | 1   | 1   | 1   | 1.2 |
| SP23 | 2   | 1   | 1   | 1   | 2   | 1.4 |
| SP24 | 3   | 3   | 3   | 4   | 3   | 3.2 |
| SP25 | 4   | 4   | 3   | 4   | 4   | 3.8 |

As shown in characteristic CT1 of FIG. 7 and Table 4, the smaller the distance CY, the harder the pattern shape of the second electrode 20 is visible. The brightness of the sample lowers as the distance CY is decreased as shown in characteristic CT2 and Table 5. As for the easiness in seeing the background, as the distance CY is decreased, the easiness in seeing the distance improves as shown in characteristic CT3 and Table 6.

The allowable range in the evaluation on whether the pattern can be recognized is determined, for example, such that the average value Ave of the evaluation values is not less than 2. In characteristic CT1, when the average Ave is not less than 2, for example, the range of the distance CY is not more than 35 mm. For example, the allowable range in the evaluation on the brightness of the sample is not less than 2 in terms of the average value Ave of the evaluation values. In characteristic CT2, for example, when the average Ave is not less than 2, the range of the distance CY is not less than 10 mm. The allowable range in the evaluation on the easiness in seeing the background is, for example, not less than 2 in terms of the average value Ave. In characteristic CT3, for example, when the average value Ave is not less than 2, the range of the distance CY is not more than 35 mm.

Therefore, the distance CY is set to the range not less than 10 mm and not more than 35 mm, for example. Within this range, the pattern of the second electrode 20 may become hard to be visible. For example, the decrease in brightness can be suppressed. For example, the background image becomes easily visible.

FIG. 8A to FIG. 8E are schematic plan views illustrating samples used in the third test to evaluate the organic electroluminescent device according the first embodiment.

Figure 8A:
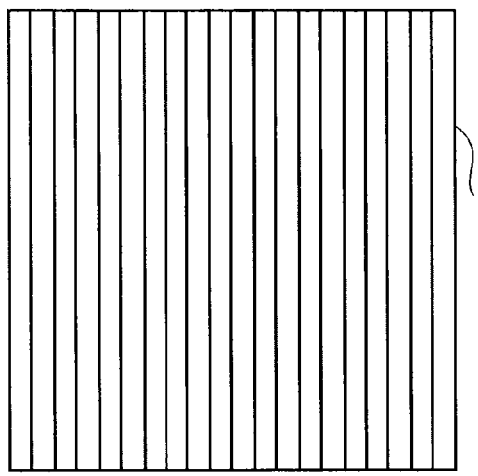
FIGS. 8A to 8E are schematic plan views illustrating samples used in the third test to evaluate the organic electroluminescent device according the first embodiment.
Figure 8D:
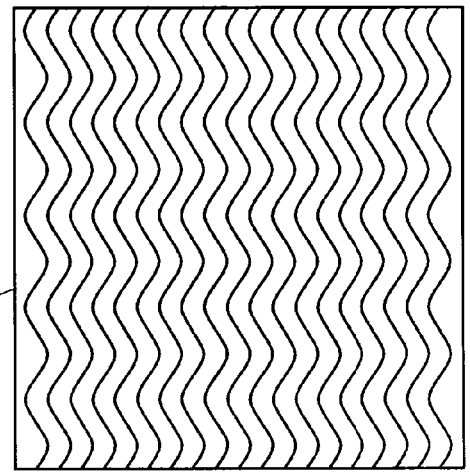
Figure 8B:
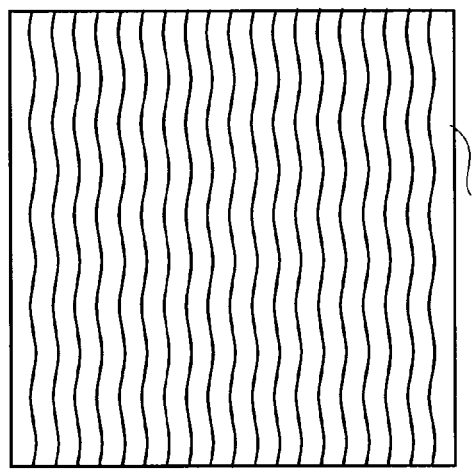
Figure 8E:
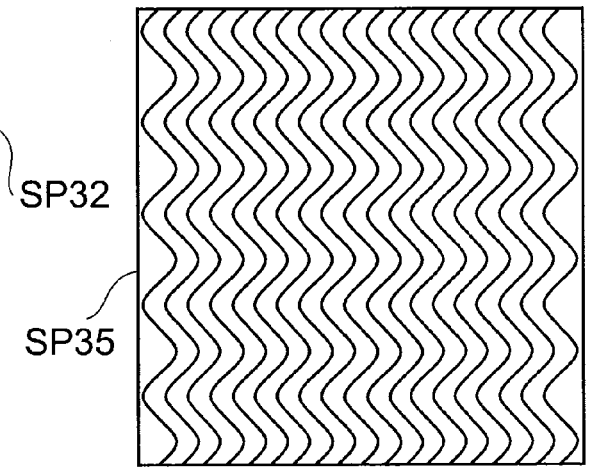
Figure 8C:
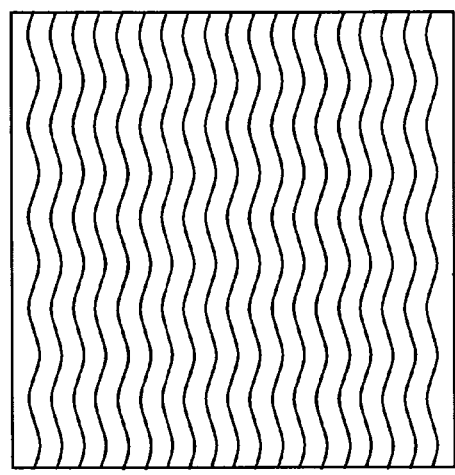

As shown in FIG. 8A to FIG. 8E, in the third test, five samples, from a first sample for amplitude examination SP31 to a fifth sample for amplitude examination SP35, were used. As shown in FIG. 8A, a striped pattern was formed in the first sample for amplitude evaluation SP31. As shown in FIG. 8B to FIG. 8E, a wavy pattern was formed in each of the second to fifth samples for amplitude evaluation SP32 to SP35.

In the first to fifth samples for amplitude evaluation SP31 to SP35, the width (length WD) of a line in the X-axis direction was 0.26 mm. In the first to fifth samples for amplitude evaluation SP31 to SP35, a gap (pitch PI) in the X-axis direction between two lines which were closest to each other was 5 mm. In the second to fifth samples for amplitude evaluation SP32 to SP35, the distance CY of one period was 20 mm. In the second sample for amplitude evaluation SP32, the amplitude AP was 0.625 mm. In the third sample for amplitude evaluation SP33, the amplitude AP was 1.25 mm. In the fourth sample for amplitude evaluation SP34, the amplitude AP was 2.50 mm. In the fifth sample for amplitude evaluation SP35, the amplitude AP was 3.75 mm. In the pattern of the first sample for amplitude evaluation SP31, the amplitude AP was 0 mm. In this way, the difference in the amplitude AP of the second electrode 20 was evaluated in the third test.

Figure 9:
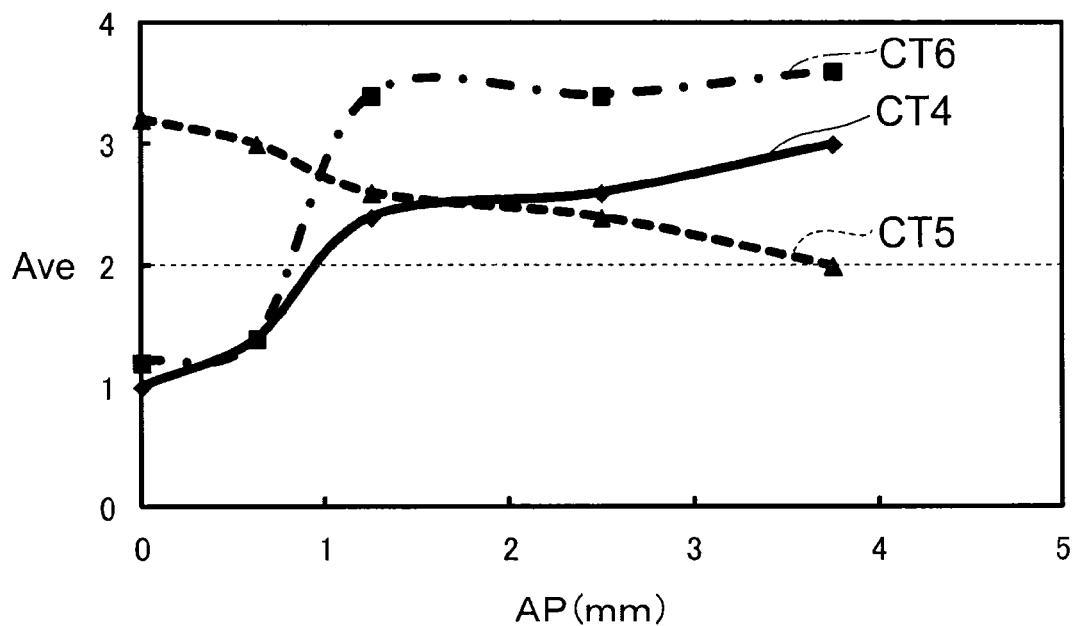
FIG. 9 is a graph that shows the result of the third test of the organic electroluminescent device according to the first embodiment.

FIG. 9 is a graph that shows the result of the third test of the organic electroluminescent device according to the first embodiment.

The vertical axis of FIG. 9 indicates average values Ave of the evaluation values. The horizontal axis indicates amplitudes AP (mm). In FIG. 9, characteristic CT4 is a result of the evaluation on whether the pattern can be recognized. Characteristic CT5 is a result of the evaluation on the brightness of the sample. Characteristic CT6 is a result of the evaluation on the easiness in seeing the background. Moreover, the result of the evaluation on whether the pattern can be recognized in the third test is shown in Table 7. Table 8 shows a result of the evaluation on the brightness of the sample. Table 9 shows a result of the evaluation on the easiness in seeing the background.

TABLE 7

|      | TS1 | TS2 | TS3 | TS4 | TS5 | Ave |
|------|-----|-----|-----|-----|-----|-----|
| SP31 | 1   | 1   | 1   | 1   | 1   | 1   |
| SP32 | 1   | 2   | 2   | 1   | 1   | 1.4 |
| SP33 | 2   | 2   | 3   | 3   | 2   | 2.4 |
| SP34 | 3   | 2   | 3   | 2   | 3   | 2.6 |
| SP35 | 3   | 3   | 4   | 3   | 2   | 3   |

TABLE 8

|      | TS1 | TS2 | TS3 | TS4 | TS5 | Ave |
|------|-----|-----|-----|-----|-----|-----|
| SP31 | 3   | 3   | 4   | 3   | 3   | 3.2 |
| SP32 | 3   | 3   | 3   | 2   | 4   | 3   |
| SP33 | 4   | 2   | 1   | 3   | 3   | 2.6 |
| SP34 | 3   | 2   | 2   | 2   | 3   | 2.4 |
| SP35 | 2   | 2   | 1   | 2   | 3   | 2   |

TABLE 9

|      | TS1 | TS2 | TS3 | TS4 | TS5 | Ave |
|------|-----|-----|-----|-----|-----|-----|
| SP31 | 1   | 1   | 2   | 1   | 1   | 1.2 |
| SP32 | 1   | 2   | 1   | 2   | 1   | 1.4 |
| SP33 | 4   | 4   | 3   | 3   | 3   | 3.4 |
| SP34 | 3   | 3   | 4   | 4   | 3   | 3.4 |
| SP35 | 3   | 4   | 4   | 3   | 4   | 3.6 |

As shown in the characteristic CT4 of FIG. 9 and Table 7, the pattern shape of the second electrode 20 becomes harder to be visible as the amplitude AP is increased. As shown in the characteristic CT5 and Table 8, the brightness of the sample lowers as the amplitude AP is increased. As shown in the characteristic CT6 and Table 9, the easiness in seeing the background improves as the amplitude AP is increased.

For example, an allowable range in the evaluation on whether the pattern can be recognized is set to be, for example, not less than 2 in terms of an average value Ave of evaluation values. In the characteristic CT4, for example, the range of the amplitude AP is not less than 1 mm when the average Ave is not less than 2. The allowable range in the evaluation on the brightness of the sample is, for example, set such that the average value Ave of the evaluation values is not less than 2. In the characteristic CT5, for example, when the average Ave is not less than 2, the range of the amplitude AP is at most 3.75 mm. The allowable range in the evaluation on the easiness in seeing the background is set to, for example, not less than 2 in terms of the average value Ave of the evaluation values. In the characteristic CT6, when the average value Ave is not less than 2, for example, the allowable range of the amplitude AP is a range not less than 1 mm.

Therefore, the amplitude AP is set to be not less than 1 mm and not more than 3.75 for example. As a result, the pattern of the second electrode 20 may become hard to be visible for example. For example, the decrease in brightness can be suppressed. For example, the background image may become easy to be visible.

The inventors of the application examined the length WD along the X-axis direction of each of the plurality of second electrodes 20. In samples used for this examination, a plurality of belt-like Ag films was provided on a glass substrate. This Ag film corresponded to the second electrode 20. In the sample, a striped pattern was formed. The pitch of the belt-like pattern of the Ag film which corresponded to the pitch PI was constant, that was, 200 μm. Samples were used in which the width (corresponding to the length WD) of the belt-like pattern of the Ag film was changed within a range of 20 μm to 100 μm. When the width of the belt-like pattern of the Ag film was 100 μm, an aperture ratio became 50%. White paper was disposed behind these samples, the distance DT between the sample and a subject was set to 0.3 m, and the width of the belt-like pattern of the Ag film which was visible was obtained. The eyesight of the subject was 1.2, and the evaluation environment was a room under fluorescent lamp.

As a result, the plurality of belt-like patterns of the Ag film was observed as separated patterns, respectively, when the width of the belt-like patterns of the Ag film was not less than 50 μm, the belt-like pattern was not observed when the width of the patterns was not more than 40 μm (corresponding to an aperture ratio of 71%). That is, the whole sample was observed as a gray area with a decreased transmittance when the width of the pattern was not more than 40 μm. On the other hand, when the width was 20 μm (an aperture ratio of 83%), the difference in brightness between an area in which the belt-like patterns were provided and the other area was small so that the sense of incompatibility was weak.

Thus, the aperture ratio of the second electrode 20 is, for example, not less than 71% in the embodiment. That is, an area of a portion 10n which does not overlap the plurality of second electrodes 20 when it is projected on the X-Y plane is not less than 71% with respect to the area of the first major surface 10a. Moreover, the aperture ratio of the second electrodes 20 is, for example, not less than 83%. As the aperture ratio of the second electrode 20 is increased, and the transmittance of the organic electroluminescent device improves. However, when the aperture ratio is increased, an area of the light emitting region 44 is decreased.

Figure 10:
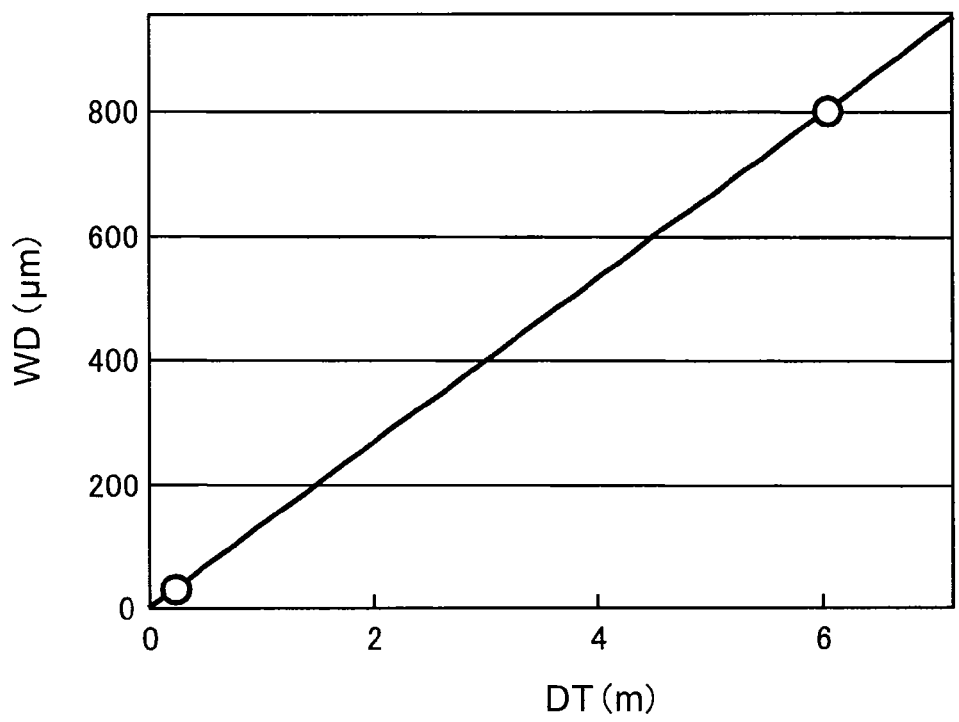
FIG. 10 is a graph illustrating the characteristic of the organic electroluminescent device according to the first embodiment.

FIG. 10 is a graph that illustrates the characteristic of the organic electroluminescent device according to the first embodiment.

FIG. 10 illustrates a relationship between a distance DT between an organic electroluminescent device and a subject, and a length WD at which a pattern is not observed. The horizontal axis indicates the distance DT, and the vertical axis indicates the lengths WD. The length WD corresponds to a maximum width at which the pattern is not observed.

As shown in FIG. 10, the length WD at which the pattern is not observed is proportional to the distance DT. The length WD is 40 μm when the distance DT is 0.3 m. The length WD becomes 800 μm when the distance DT is 6 m. That is, the maximum length WD at which the pattern is not observed can be represented by Expression (1).

$$WD = (400/3) \cdot DT \times 10^{-6} \text{ (m)} \tag{1}$$

When the organic electroluminescent device according to the embodiment is used for lighting or the like, the distance DT between the lighting apparatus and the user may be changed. In the embodiment, the length WD is decided based on the distance DT that depends on the usage.

The inventors of the application examined the pitch PI in the X-axis direction between two second electrodes 20 which are closest to each other. When a visual angle is represented by V and the distance between an organic electroluminescent device and a subject is represented by DT, the pitch PI can be represented by Expression (2).

$$V = 2 \cdot \arctan(PI/2DT) \qquad (2)$$

The human eyes' spatial frequency detection limit at high contrast is 50 to 60 cycles per degree (CPD). When this is converted into a visual angle V, it becomes $0.95 \times 1/60°$ to $1.2 \times 1/60°$. For example, when the distance DT is set to 1 m and the visual angle V is set to $0.95 \times 1/60°$, the maximum pitch PI, at which the pattern is not observed, calculated from Expression (2) is 350 μm. For example, when the distance DT is set to 10 m and the visual angle V is set to $0.95 \times 1/60°$, the maximum pitch PI, at which the pattern is not observed, calculated from Expression (2) is 3.5 mm. In the embodiment, the pitch PI is decided based on the distance DT which depends on the usage like the length WD.

When the pattern shape of the second electrode 20 is decided to be a wave shape or a zigzag shape, the pattern becomes hard to be recognized compared to the stripe shape. As a result, the background image becomes easy to be visible in the organic electroluminescent device of a see-through type. This is a new effect discovered by the inventor(s) of the application through the execution of the first test.

Moreover, the second test shows the result that, when the distance between the organic electroluminescent device and the user is 5 m and the pitch PI is 5 mm, the distance CY is, for example, not less than 10 mm and not more than 35 mm. The third test shows the result that, when the distance between the organic luminescent device and the user is 5 m and the pitch PI is 5 mm, the amplitude AP is, for example, not less than 1 mm and not more than 3.75 mm. A retinal image when an object of 1 mm is observed from a distance of 1 m is substantially the same as a retinal image when an object of 5 mm is observed from a distance of 5 m. Accordingly, a ratio CY/PI between the pitch PI and the distance CY is, for example, not less than 2 and not more than 7. A ratio AP/PI between the pitch PI and the amplitude AP is, for example, not less than 0.2 and not more than 0.75. With this setting, the pattern shape of the second electrode 20 becomes hard to be recognized, and the background image becomes easy to be visible.

Optimal conditions responding to the usage of the organic electroluminescent device can be obtained from the above-described results. For example, when the usage is a hand lamp or the like, that is, when the distance between the organic electroluminescent device and the user is anticipated to be not less than 0.5 m and not more than 1.0 m, especially when it is 0.5 m, the distance CY is set to be not less than 1 mm and not more than 3.5 mm and the amplitude AP is set to be not less than 0.1 mm and not more than 0.375 mm.

For example, when the usage is an indoor lamp or the like, that is, when the distance between the organic electroluminescent device and the user is anticipated to be not less than 1.0 m and not more than 3.0 m, especially when it is 1.0 m, the distance CY is set to be not less than 2 mm and not more than 7 mm and the amplitude AP is set to be not less than 0.2 mm and not more than 0.75 mm.

For example, the usage is a skylight lamp or the like, that is, when the distance between the organic luminescent device and the user is anticipated to be not less than 3.0 m and not more than 5.0 m, especially when it is 3.0 m, the distance CY is set to be not less than 6 mm and not more than 21 mm and the amplitude AP is set to be not less than 0.6 mm and not more than 2.25 nm.

For example, when the usage is an outdoor lamp or the like, that is, when the distance between the organic luminescent device and the user is anticipated to be not less than 5.0 m, especially when it is 5.0 m, the distance CY is set to be not less than 10 mm and not more than 35 mm, and the amplitude AP is set to be not less than 1 mm and not more than 3.75 mm.

As a result, the pattern shape of the second electrode 20 may become hard to be recognized and the background image may become easy to be visible. Moreover, the miniaturization of the second electrode 20 is alleviated. For example, it is possible to suppress the manufacturing process from being complicated. In addition, it is possible to suppress the pitch between the second electrodes 20 from being excessively increased and an area of the light emitting region 44 from being decreased.

Figure 11:
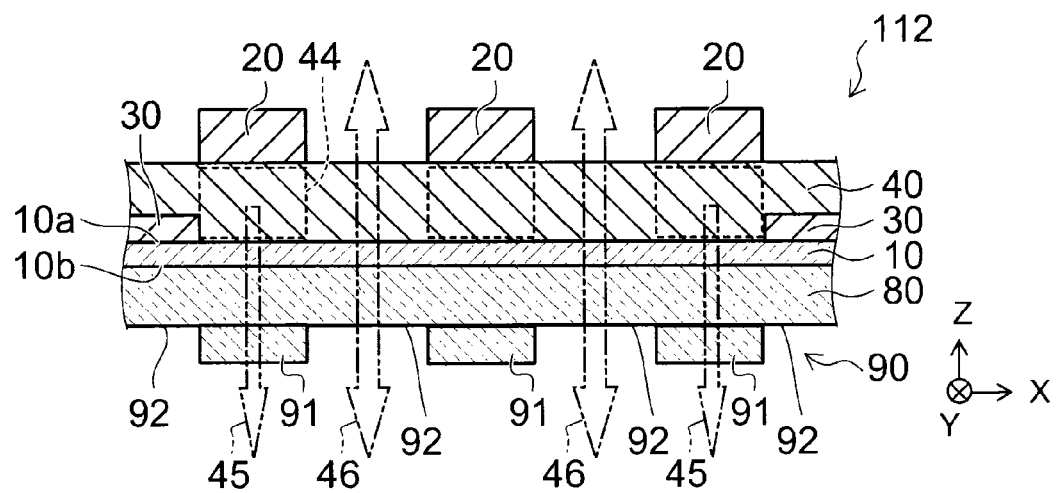
FIG. 11 is a schematic cross-sectional view illustrating the configuration of another organic electroluminescent device according to the first embodiment.

FIG. 11 is a schematic cross-sectional view illustrating the configuration of another organic electroluminescent device according to the first embodiment. As shown in FIG. 11, another organic electroluminescent device 112 according to the embodiment further includes a light-scattering layer 90. In the organic electroluminescent device 112, a first electrode 10 is provided between a second electrode 20 and the light-scattering layer 90. For example, the light-scattering layer 90 is provided under a substrate 80. For example, the light-scattering layer 90 is provided on a face of the substrate 80 which is opposite to another face that faces the first electrode 10. For example, in a case of a configuration in which the substrate 80 is not included, the light-scattering layer 90 may be provided on a second major surface 10b.

The light-scattering layer 90 includes a plurality of light-scattering portions 91 and a plurality of non-scattering portions 92. The plurality of light-scattering portions 91 faces a plurality of second electrodes 20, respectively. That is, the plurality of light-scattering portions 91 overlaps the plurality of the second electrodes 20, respectively, when they are projected on an X-Y plane. For example, the light-scattering portions 91 match the second electrodes 20 in shape, which is a wave shape or a zigzag shape. Each of the plurality of non-scattering portions 92 is provided between the plurality of light-scattering portions 91.

For example, the light-scattering portions 91 change a traveling direction of incident emitted light 45. For example, the light-scattering portions 91 scatter the incident emitted light 45. For example, the non-scattering portion 92 does not substantially change a traveling direction of incident external light 46. For example, the non-scattering portion 92 does not substantially scatter the incident external light 46. A light-scattering capability of the non-scattering portion 92 is lower than a light-scattering capability of the light-scattering portion 91.

The light-scattering layer 90 suppresses the total reflection of the emitted light 45 at a front face of the substrate 80 by changing the traveling direction of the emitted light 45 so as to be directed to the light-scattering portions 91. As a result, for example, the light extraction efficiency of the organic electroluminescent device 112 improves. For example, the luminous efficiency of the organic electroluminescent device 112 improves. Furthermore, the second electrode 20 may become hard to be visible in a state in which the organic light-emitting layer 40 does not emit light. Moreover, the light-scattering layer 90 includes the non-scattering portions 92, and does not substantially change the traveling direction of the external light 46. As a result, for example, the transparency of the organic electroluminescent device 112 improves.

A resin layer in which a plurality of particles is dispersed may be used as the light-scattering portions 91, for example. In this case, a refractive index of the particle is higher than a refractive index of the resin layer. For example, polysiloxane-based polymers or the like may be used for material of the resin layer. For example, silica particles, polystyrene particles, and/or the like may be used as the particles. Moreover, the light-scattering portions 91 have a configuration in which undulations having a micro lens shape or a pyramid shape are included.

The non-scattering portion 92 is, for example, an area, in which the light-scattering portion 91 is not formed, within the light-scattering layer 90. For example, the non-scattering portions 92 may have a flat surface obtained by burying the micro lens-shaped or pyramid-shaped undulations.

Moreover, when an interconnection 30 is light reflective as in the embodiment, the interconnection 30 may be formed to have the same shape as the second electrode 20. That is, a ratio CY/PI between a pitch PI between the interconnection 30 and the neighboring second electrode 20 and a distance CY of each of the interconnection 30 and the neighboring second electrode 20 is set to be, for example, not less than 2 and not more than 7, and a ratio AP/PI between the pitch PI between the interconnection 30 and the neighboring second electrode 20 and the amplitude AP of each of the interconnection 30 and the neighboring second electrode 20 may be set to be, for example, not less than 0.2 and not more than 0.75.

Second Embodiment

Figure 12:
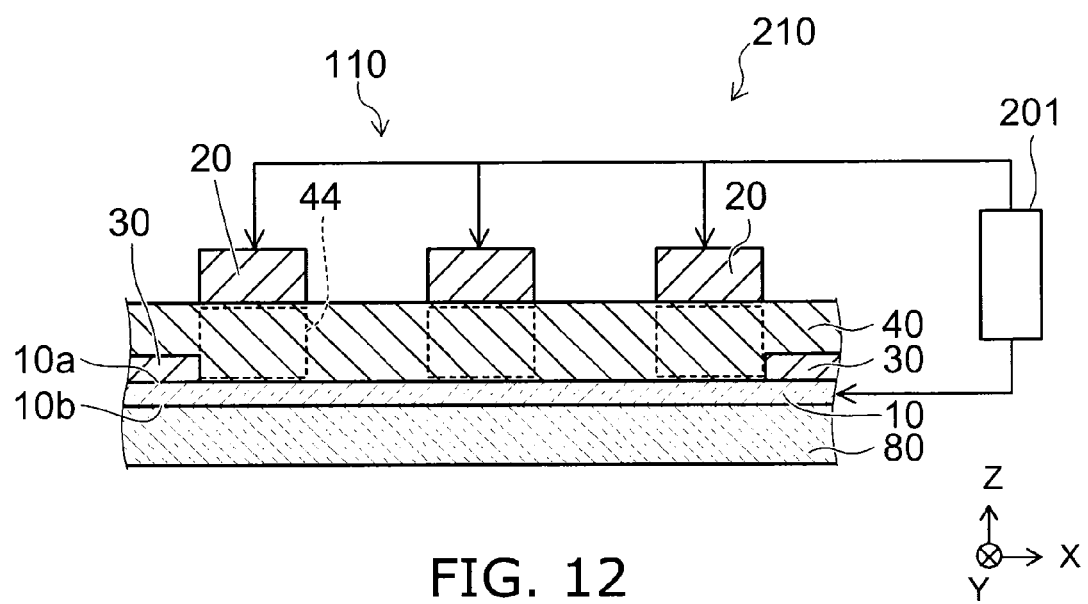
FIG. 12 is a schematic diagram illustrating the configuration of a lighting apparatus according to a second embodiment.

FIG. 12 is a schematic diagram that illustrates a configuration of a lighting apparatus according to a second embodiment. As shown in FIG. 12, a lighting apparatus 210 according to this embodiment includes the organic electroluminescent device according to the first embodiment (for example, the organic electroluminescent device 110) and a power supply unit 201.

The power supply unit 201 is electrically connected to a first electrode 10 and a second electrode 20. The power supply unit 201 supplies an electric current to an organic light-emitting layer 40 through the first electrode 10 and the second electrode 20. With use of the lighting apparatus 210 according to the embodiment, a see-through type lighting apparatus can be provided in which a pattern shape of a second electrode 20 is hard to be recognized and a background image is easy to be visible.

According to the embodiment, an optical transparency organic electroluminescent device and a lighting apparatus are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the embodiments of the invention have been described with reference to specific examples. However, the embodiments of the invention are not limited to these specific examples. For example, as for a specific configuration of each component such as the first electrode, the second electrode, and the organic light-emitting layer included in the organic electroluminescent device, and the power supply unit included in the lighting apparatus, when it is suitably selected from a well-known range by those skilled in the art to implement the invention similarly, as long as the same effect can be obtained, the selection may fall within the scope of the invention.

Further, any two or more components of the specific examples may be combined within the extent of technical feasibility and are included in the scope of the invention to the extent that the purport of the invention is included.

Moreover, all organic electroluminescent devices, lighting apparatuses and methods for manufacturing the organic electroluminescent device practicable by an appropriate design modification by one skilled in the art based on the organic electroluminescent devices, the lighting apparatuses and the methods for manufacturing the organic electroluminescent devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
   a first electrode including a first major surface and being optical transparency;
   a plurality of second electrodes extending in a first direction parallel to the first major surface and being separated from each other in a second direction parallel to the first major surface and perpendicular to the first direction, an optical transmittance of the second electrodes being lower than an optical transmittance of the first electrode, a distance along the second direction between a line extending in the first direction and a side surface of each of the second electrodes continuously increasing and decreasing along the first direction, the side surface being unparallel to the first major surface; and
   an organic light-emitting layer provided between the first electrode and the second electrodes.

2. The device according to claim 1,
   wherein the increase and the decrease of the distance are periodic, and
   when a pitch in the second direction between two of the second electrodes being closest to each other is represented by PI, a distance of one period of the increase and decrease of the distance is represented by CY, and an amplitude of the increase and decrease is represented by AP, a ratio CY/PI between the distance CY and the pitch PI is not less than 2 and not more than 7, and a ratio AP/PI between the pitch PI and the amplitude AP is not less than 0.2 and not more than 0.75.

3. The device according to claim 2,
   wherein the distance CY is not less than 1 mm and not more than 3.5 mm and the amplitude AP is not less than 0.1 mm and not more than 0.375 mm.

4. The device according to claim 2,
   wherein the distance CY is not less than 2 mm and not more than 7 mm and the amplitude AP is not less than 0.2 mm and not more than 0.75 mm.

5. The device according to claim 2,
   wherein the distance CY is not less than 6 mm and not more than 21 mm and the amplitude AP is not less than 0.6 mm and not more than 2.25 mm.

6. The device according to claim 2,
wherein the distance CY is not less than 10 mm and not more than 35 mm and the amplitude AP is not less than 1 mm and not more than 3.75 mm.

7. The device according to claim 1,
wherein the distance increases and decreases in a wave shape.

8. The device according to claim 1,
wherein the distance increases and decreases in a zigzag shape.

9. The device according to claim 1,
wherein a variation ratio in the first direction of a length along the second direction of the second electrodes is not more than 10%.

10. The device according to claim 1,
wherein a length along the second direction of the second electrodes is not less than 1 μm and not more than 2000 μm.

11. The device according to claim 1, further comprising:
a light scattering layer including a plurality of light-scattering portions and a plurality of non-scattering portions, the first electrode being provided between the second electrodes and the light-scattering layer,
the light-scattering portions overlapping with the second electrodes when the light-scattering portions are projected on a planar face parallel to the first major surface,
each of the non-scattering portions is provided between the light-scattering portions, and
a light scattering capability of the non-scattering portions being weaker than a light-scattering capability than the light-scattering portions.

12. The device according to claim 1, further comprising:
an interconnection provided between the first electrode and the organic light-emitting layer and being disposed at a region of a portion with which the second electrodes do not overlap when projected on a planar face parallel to the first major surface,
a conductivity of the interconnection being higher than a conductivity of the first electrode.

13. The device according to claim 12,
wherein an optical reflectivity of the interconnection is higher than an optical reflectivity of the first electrode.

14. The device according to claim 12,
wherein the interconnection includes at least one element selected from the group consisting of Mo, Ta, Nb, Al, Ni, and Ti.

15. The device according to claim 1,
wherein the first electrode includes an oxide including at least one element selected from the group consisting of In, Sn, Zn, and Ti.

16. The device according to claim 1,
wherein the second electrodes include at least one of aluminum and silver.

17. The device according to claim 1,
wherein the organic light-emitting layer emits white light when a voltage is applied between the first electrode and the second electrode.

18. The device according to claim 1,
wherein the organic light-emitting layer is optical transparency in a state in which the organic light-emitting layer does not emit light.

19. The device according to claim 1,
wherein, when projected on a planar face parallel to the first major surface, an area of the first major surface which does not overlap the second electrodes is not less than 71% with respect to an area of the first major surface.

20. A lighting apparatus comprising:
an organic electroluminescent device; and
a power supply unit,
the organic electroluminescent device including:
    a first electrode including a first major surface and being optical transparency;
    a plurality of second electrodes extending in a first direction parallel to the first major surface and being separated from each other in a second direction parallel to the first major surface and perpendicular to the first direction, an optical transmittance of the second electrodes being lower than an optical transmittance of the first electrode, a distance along the second direction between a line extending in the first direction and a side surface of each of the second electrodes continuously increasing and decreasing along the first direction, the side surface being unparallel to the first major surface; and
    an organic light-emitting layer provided between the first electrode and the second electrodes,
the power supply unit being electrically connected between the first electrode and the second electrodes and supplying a current to the organic light-emitting layer through the first electrode and the second electrodes.

* * * * *